(12) United States Patent
Lee (10) Patent No.: US 9,572,248 B2
(45) Date of Patent: Feb. 14, 2017

(54) DISPLAY DEVICE

(71) Applicant: SAMSUNG DISPLAY CO., LTD., Yongin, Gyeonggi-Do (KR)

(72) Inventor: Hee-Kwon Lee, Asan-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 14 days.

(21) Appl. No.: 14/800,805

(22) Filed: Jul. 16, 2015

(65) Prior Publication Data

US 2016/0212838 A1 Jul. 21, 2016

(30) Foreign Application Priority Data

Jan. 14, 2015 (KR) .................. 10-2015-0006998

(51) Int. Cl.
*H05K 1/02* (2006.01)
*H05K 1/09* (2006.01)
(Continued)

(52) U.S. Cl.
CPC ............ *H05K 1/028* (2013.01); *G09G 3/3611* (2013.01); *H05K 1/09* (2013.01); *H05K 1/111* (2013.01);
(Continued)

(58) Field of Classification Search
CPC .............. G09G 2300/0426; G09G 3/3233; G09G 3/36; G09G 3/3611; G06F 3/0412; H05K 3/361; H05K 1/117; H05K 1/114; H05K 2201/09436; H05K 3/323; H05K 2201/10128; H05K 1/028; H05K 1/189; H05K 1/147; H05K 2201/10681; H05K 2201/09781; H05K 1/09; H05K 1/111; H05K 1/118; H05K 2201/056; H05K 5/03; H05K 2201/09409; H05K 2201/09481; H05K 2201/09672; H05K 5/0017; H01L 24/86; H01L 27/3276; H01L 2924/14; H01L 27/3225; H01L 27/3241; H01L 27/3244; G02F 1/13452; G02F 1/13458; G02F 2001/133357; G02F 2001/133388; G02F 1/13; G02F 1/1309; G02F 1/133; G02F 1/1333; G02F 1/133305; G02F 1/133308; G02F 1/13338; G02F 1/13454
See application file for complete search history.

(56) References Cited

U.S. PATENT DOCUMENTS

2005/0139963 A1* 6/2005 Kang ................ H01L 23/49838
257/620
2009/0147204 A1* 6/2009 Kang .................. G02F 1/13452
349/150
(Continued)

FOREIGN PATENT DOCUMENTS

KR   10-2011-0014033 A    2/2011
KR   10-2013-0101192 A    9/2013
KR   10-1324554 B1       11/2013

*Primary Examiner* — Hong Zhou
(74) *Attorney, Agent, or Firm* — Lee & Morse, P.C.

(57) ABSTRACT

A display device, including a display panel displaying an image; a chip on film (COF) connected to the display panel and on which a driving integrated circuit is mounted; and a printed circuit board (PCB) connected to the COF and including a driving circuit for driving the display panel, in the COF, on a film, a first pad portion being connected to the driving integrated circuit by a first wiring line, a second pad portion being connected to the driving integrated circuit by a second wiring line, and a solder resist being applied to the first and second wiring lines, the second pad portion being spaced from and offset from the first pad portion, and the PCB including stepped portions at sides of first and second corresponding pad portions connected with the first and second pad portions, respectively, to receive a portion of the solder resist.

14 Claims, 7 Drawing Sheets

(51) Int. Cl.
*G09G 3/36* (2006.01)
*H05K 1/11* (2006.01)
(52) U.S. Cl.
CPC ............... *H05K 2201/09781* (2013.01); *H05K 2201/10128* (2013.01)

(56) References Cited

U.S. PATENT DOCUMENTS

| | | | | |
|---|---|---|---|---|
| 2011/0141042 | A1* | 6/2011 | Kim | G02F 1/13338 345/173 |
| 2012/0281383 | A1* | 11/2012 | Hwang | G02F 1/133308 361/807 |
| 2013/0076704 | A1* | 3/2013 | Song | G02B 27/26 345/204 |
| 2013/0148312 | A1* | 6/2013 | Han | H05K 7/00 361/736 |
| 2013/0341597 | A1* | 12/2013 | Kim | H01L 27/3225 257/40 |
| 2014/0254119 | A1* | 9/2014 | Im | C09J 9/02 361/767 |
| 2014/0306348 | A1* | 10/2014 | Ahn | H01L 23/4985 257/773 |
| 2014/0355227 | A1* | 12/2014 | Lim | H05K 1/028 361/749 |
| 2015/0129853 | A1* | 5/2015 | Shin | H01L 27/3213 257/40 |

* cited by examiner

DISPLAY DEVICE

CROSS-REFERENCE TO RELATED APPLICATION

Korean Patent Application No. 10-2015-0006998, filed on Jan. 14, 2015, in the Korean Intellectual Property Office, and entitled: "Display Device," is incorporated by reference herein in its entirety.

BACKGROUND

1. Field

Embodiments relate to a display device.

2. Description of the Related Art

A liquid crystal display, which may include a liquid panel having a liquid crystal between upper and lower substrates, polarizers for polarizing light at both sides of the liquid crystal panel, a light source and for supplying a predetermined amount of light to the liquid crystal panel, and a light guide. Such a device may display images in response to image signals from the outside.

An organic light emitting diode display may include two electrodes and an organic light emission layer between the electrodes, in which an electron injected from a cathode, which is one of the electrodes, and a hole injected from an anode, which is the other electrode, may produce an exciton by being bonded and the exciton may emit light while discharging energy.

Such an organic light emitting diode may display a characteristic of self-light emission and may not require a different or separate light source, unlike a liquid crystal display, and its thickness and weight may be reduced. An organic light emitting diode display may have excellent characteristics such as low power consumption, high luminance, and a high response speed.

SUMMARY

Embodiments may be realized by providing a display device, including a display panel displaying an image; a chip on film (COF) connected to the display panel and on which a driving integrated circuit is mounted; and a printed circuit board (PCB) connected to the COF and including a driving circuit for driving the display panel, in the COF, on a film, a first pad portion being connected to the driving integrated circuit by a first wiring line, a second pad portion being connected to the driving integrated circuit by a second wiring line, and a solder resist being applied to the first wiring line and the second wiring line, the second pad portion being spaced from and offset from the first pad portion, and the PCB including stepped portions at sides of a first corresponding pad portion and a second corresponding pad portion connected with the first pad portion and the second pad portion, respectively, to receive a portion of the solder resist.

The stepped portions may correspond to the second wiring line of the COF.

The first pad portion and the second pad portion of the COF may be connected to the first corresponding pad portion and the second corresponding pad portion of the PCB, respectively, through an anisotropic conductive film (ACF).

The PCB may include a first cover layer including a plan portion supporting the first corresponding pad portion and the second corresponding pad portion and the stepped portion having a height difference from the plan portion; and a second cover layer attached to the first cover layer with an adhesive layer therebetween, the second cover layer exposing the first corresponding portion and the second corresponding portion.

A first thickness that is the sum of thicknesses of the second wiring line, the ACF, and the solder resist may be larger than a second thickness that is the sum of thicknesses of the first or second pad portion, the ACF, and the first or second corresponding pad portion.

A part of the solder resist exceeding the second thickness from the first thickness may be filled in the stepped portions.

The PCB may further include dummy pads protruding at the stepped portions.

The dummy pads may include a plurality of lines at the stepped portions.

The solder resist filled in the stepped portions may be attached to the dummy pads.

The driving integrated circuit may be disposed in a second direction crossing a first direction in which the film is elongated, the first pad portion may be spaced from the driving integrated circuit in the first direction, the first wiring line may connect the first pad portion to the driving integrated circuit, the second pad portion may be spaced from the first pad portion in the first direction, and the second wiring line may be connected to the driving integrated circuit, the second wiring line disposed around the first pad portion, the second pad portion, and the first wiring line.

The PCB may further have adhesion surface extensions formed concavely or convexly at the stepped portions.

The adhesion surface extensions may include a plurality of lines at the stepped portions.

The plurality of lines may be spaced from each other.

The solder resist filled in the stepped portions may be attached to the adhesion surface extensions.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The term "on/above" used throughout the specification means "on/above or beneath/under" the object and it does not mean "vertically upward". Throughout the specification, unless explicitly described to the contrary, the word "comprise" and variations such as "comprises" or "comprising", will be understood to imply the inclusion of stated elements but not the exclusion of any other elements.

Hereinafter, a display device according to a first exemplary embodiment will be described in detail with reference to FIG. 1.

Figure 1:
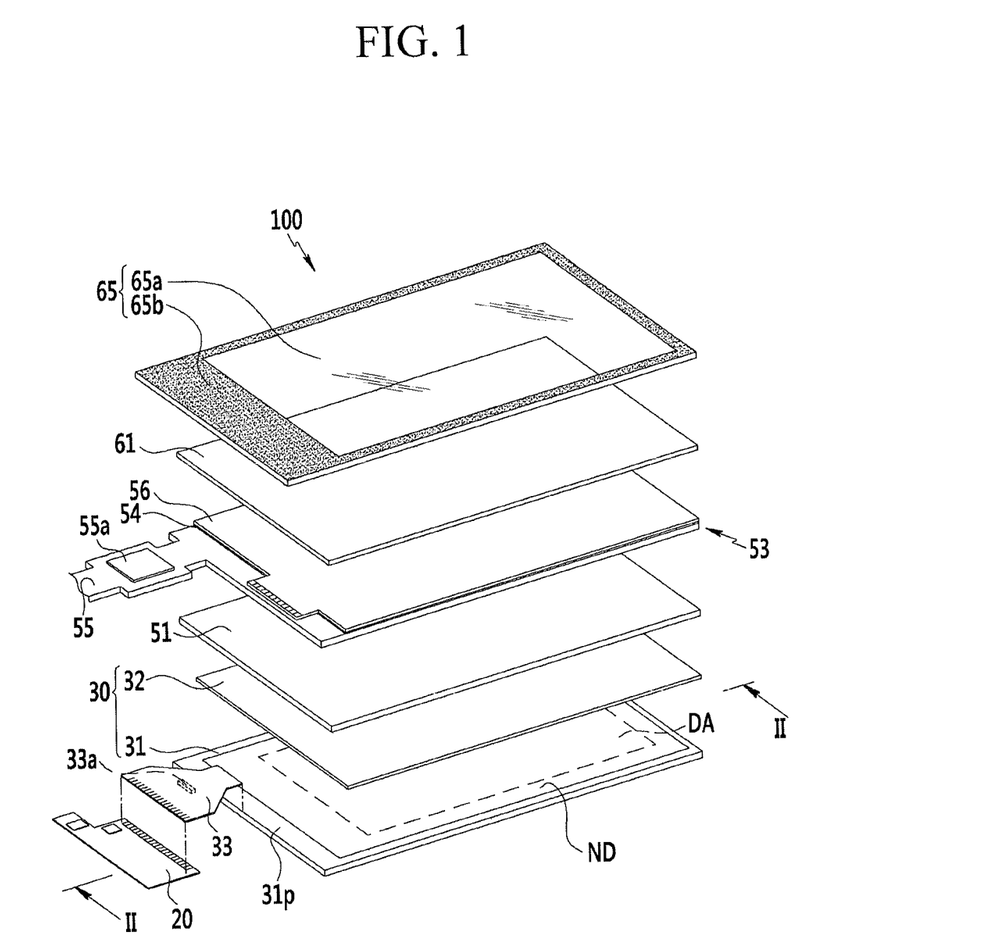
FIG. 1 illustrates an exploded perspective view of a display device according to a first exemplary embodiment.
Figure 2:
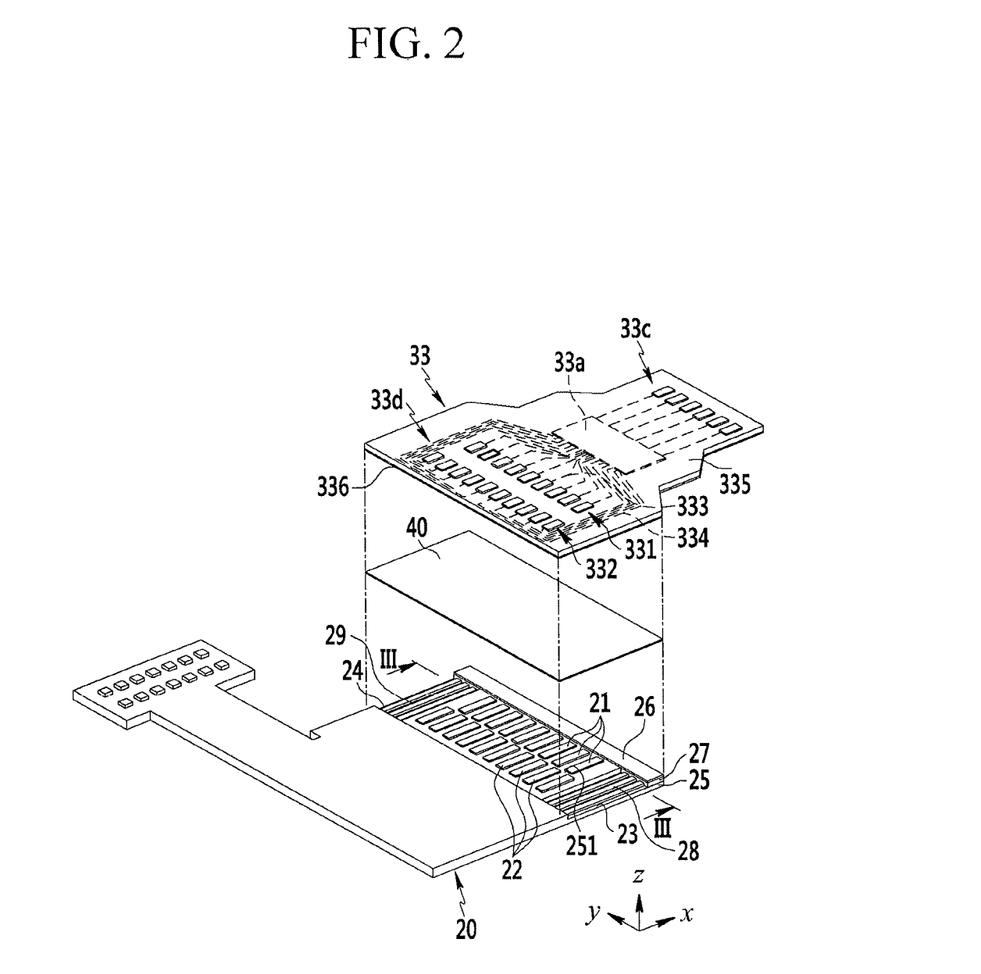
FIG. 2 illustrates an exploded perspective view of the Chip on Film (COF) and the printed circuit board (PCB) illustrated in FIG. 1.

FIG. 1 illustrates an exploded perspective view of a display device according to a first exemplary embodiment. Referring to FIGS. 1 and 2, in a display device according to a first exemplary embodiment, a touch screen panel 53 may be bonded on a display panel 31 and a window substrate 65 may be bonded on the touch screen panel 53 to cover the display panel 31 and the touch screen panel 53.

The display panel 31 may display an image using a plurality of pixels arranged in a matrix, and the display panel 31 may be an organic light emitting panel in the present exemplary embodiment. The display panel 31 may be flexible by being formed on a flexible substrate, and the display panel 31 may be a curved panel, a bendable panel, or a foldable panel.

The display panel 31 may include a pad portion 31p at an edge thereof, and terminal pads extending from a wiring of the display panel 31 may be formed at the pad portion 31p. The COF 33 may transmit an electrical signal for driving the display panel 31 from a driving circuit by connecting the terminal pads of the pad portion 31p to the driving circuit of the PCB 20.

A first end 33c of the COF 33 may be connected to the pad portion 31p of the display panel 31, and a second end 33d opposite to the first end 33c may be connected to the PCB 20 having the driving circuit.

A driving integrated circuit 33a may be mounted on the COF 33 and may generate a driving signal.

The PCB 20 may include the driving circuit for driving the display panel 31 and the touch screen panel 53 and may be a flexible printed circuit board (FPCB). For example, a timing controller may be mounted on the PCB 20 and may generate a control signal for controlling an image implemented in the display panel 31, and the control signal may be provided to the driving integrated circuit 33a through the COF 33.

Several electronic parts for controlling various functions of the display device according to the present exemplary embodiment may be further mounted on the PCB 20, and for example, a camera module, a speaker module, and a memory chip that may be operated in synchronization with the display panel 31 may be mounted.

The touch screen panel 53 may be bonded to the display panel 31. An optical film 32 may be bonded on the display panel 31, and the touch screen panel 53 may be positioned over the optical film 32. A display panel adhesive layer 51 may be disposed between the optical film 32 and the touch screen panel 53, and the touch screen panel 53 may be bonded to the display panel 31. A display panel assembly 30 may include the display panel 31 and the optical film 32.

The display panel adhesive layer 51 may be made of an optically clear adhesive (OCA), or the display panel adhesive layer 51 may be an adhesive tape or formed by applying and hardening an adhesive material.

The window substrate 65 may be larger in area than the display panel 31 and the touch screen panel 53 to cover the display panel 31 and the touch screen panel 53. The window substrate 65 may include a light transmitting portion 65a and a light blocking portion 65b. The light transmitting portion 65a may be positioned to correspond to a display area DA of the display panel 31 and an image made in the display panel 31 may be transmitted through the light transmitting portion 65a, and a user may see it. The light blocking unit 65b may include an area surrounding the light transmitting portion 65a and corresponding to a non-display area ND of the display panel 31.

The window substrate 65 may be an insulating substrate and may be made of glass or plastic. The window substrate 65 may be a flexible substrate made of plastic, and the display device may be flexible.

A touch screen panel (TSP) adhesive layer 61 may be disposed between the touch screen panel 53 and the window substrate 65, and the window substrate 65 may be be bonded to the touch screen panel 53. The TSP adhesive layer 61 may be made of an OCA, or the TSP adhesive layer 61 may be an adhesive tape or formed by applying and hardening an adhesive material.

The touch screen panel 53 may include a reinforcing film adhesive layer 54 between a TSP FPCB 55 and a reinforcing film 56. The TSP FPCB 55 may include a touch driving integrated circuit 55a.

Figure 3:
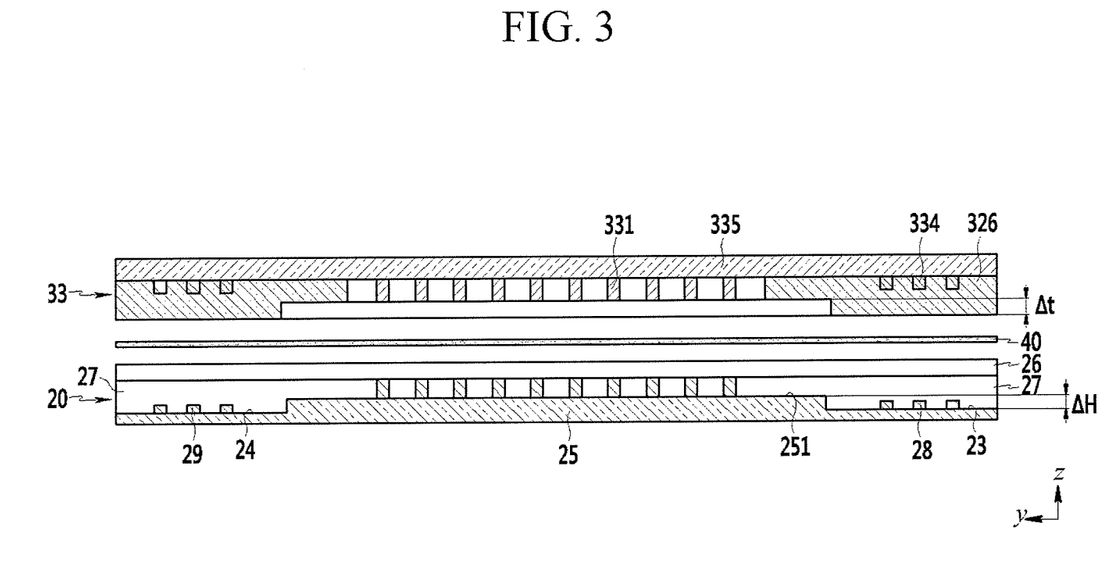
FIG. 3 illustrates an exploded cross-sectional view of the COF and the PCB taken along line III-III illustrated in FIG. 2.

FIG. 2 illustrates an exploded perspective view of the COF and the PCB illustrated in FIG. 1, and FIG. 3 illustrates an exploded cross-sectional view of the COF and the PCB taken along line III-III illustrated in FIG. 2.

Referring to FIGS. 2 and 3, the COF 33 may include a first pad portion 331 and a second pad portion 332 on a film 335 of the second end 33d, in which the first pad portion 331 may be connected to the driving integrated circuit 33a through, e.g., by, a first wiring line 333, the second pad portion 332 may be connected to the driving integrated circuit 33a through, e.g., by, a second wiring line 334, and a solder resist 336 may be applied to the film 335 to cover the first and second wiring lines 333 and 334. The second wiring line may be formed on the COF 33 peripheral to the second pad portion 332, the first pad portion 331, and the first wiring line 333. For example, in connecting the second pad portion 332 to the driving integrated circuit 33a, the second wiring line 334 may be disposed around the second pad portion 332, the first pad portion 331, and the first wiring line 333.

The driving integrated circuit 33a may be mounted on the film 335 in a second direction (y-axial direction) crossing, e.g., orthogonal to, a first direction (x-axial direction) in which the film 335 is elongated. The first pad portion 331 and the second pad portion 332 may each include a plurality of pads, and may be spaced apart from each other in the x-axial direction and may cross, e.g., be offset from or between, each other in the y-axial direction. The first pad portion 331 and the second pad portion 332 may be exposed from the solder resists 336.

In the COF 33, the first and second pad portions 331 and 332 may be spaced in the x-axial direction and connected to the driving integrated circuit 33a, and the second wiring line 334 may connect the second pad portion 332 to the driving integrated circuit 33a, going, e.g., disposed, around the first and second pad portions 331 and 332 and the first wiring line 333. In the COF 33, the first and second wiring lines 333 and 334 may be formed on the same layer on the film 335, and productivity and quality may be improved.

The second wiring line 334 may be disposed substantially outside a film 335 on the COF 33, and a solder resist 336 may protrude in a z-axial direction at a portion corresponding to the second wiring line 334 further than at a portion without the second wiring line 334. The solder resist 336 may have a thickness difference Δt measured from the film 335, depending on its position.

The PCB 20 may include a first corresponding pad portion 21 and a second corresponding pad portion 22, which may be connected to the first pad portion 331 and the second pad portion 332, respectively, and may include stepped portions 23 and 24 at both sides of the first and second corresponding pad portions 21 and 22. The first and second corresponding pad portions 21 and 22 may each include a plurality of pads, and may be spaced apart from each other in the x-axial direction and may cross, e.g., be offset from or between, each other in the y-axial direction, to correspond to the first and second pad portions 331 and 332.

The first and second corresponding pad portions 21 and 22 may be pressed and bonded to the first and second pad portions 331 and 332, and some of the solder resist 336 corresponding to the thickness difference Δt measured from the film 335 may be moved and received in, e.g., transferred to, the stepped portions 23 and 24, depending on whether there is the second wiring line 334. The stepped portions 23 and 24 may be disposed at both sides of the first and second corresponding pad portions 21 and 22 to correspond to the second wiring line 334 of the COF 33 and may receive the solder resist 36 that may be moved, e.g., displaced, to both sides in pressing, and the stepped portions 23 and 24 may help prevent interference with the solder resist 336.

For example, the PCB 20 may include a driving circuit and may include a first cover layer 25 and a second cover layer 26 attached to each other with an adhesive layer 27 therebetween. The first cover layer 25 may include a plan portion 251 supporting the first corresponding pad portion 21 and the second corresponding pad portion 22 and the stepped portions 23 and 24 formed lower than the plan portion 251, at both sides of the plan portion 251. There may be a height difference ΔH between the stepped portion 23 and the plan portion 251.

The second cover layer 26 may be attached to the first cover layer 25 with the adhesive layer 27 therebetween and may expose the first and second corresponding pad portions 21 and 22, and the first and second corresponding pad portions 21 and 22 may be connected to the first and second pad portions 331 and 332.

Figure 4:
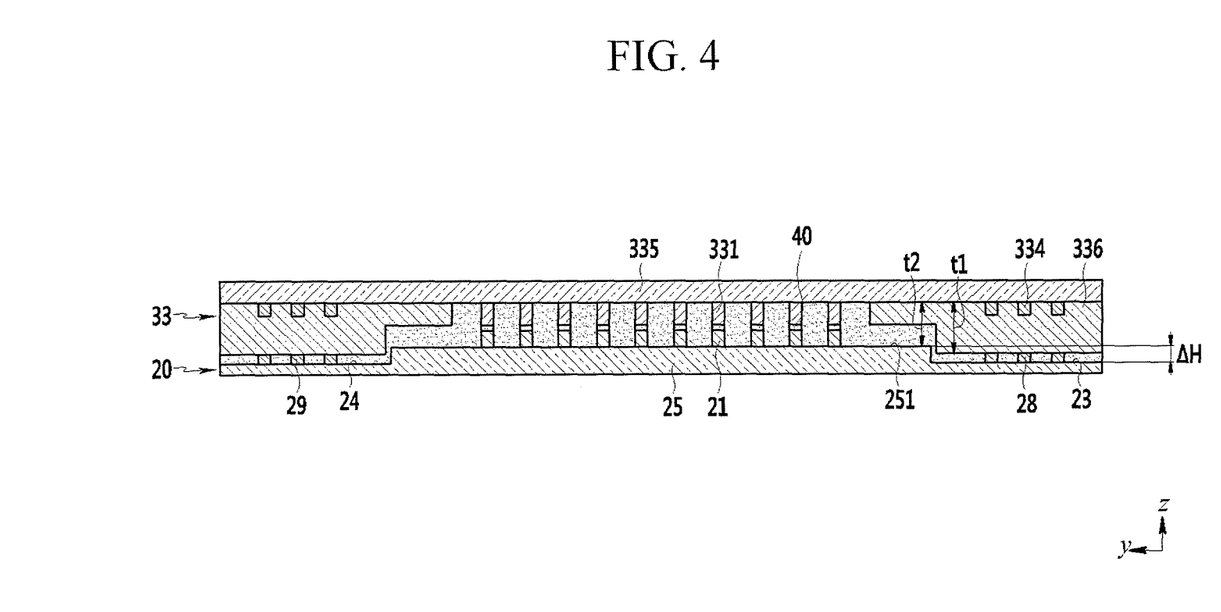
FIG. 4 illustrates a cross-sectional view of a structure in which the COF and the PCB illustrated in FIG. 3 are bonded.

FIG. 4 illustrates a cross-sectional view of a structure in which the COF and the PCB illustrated in FIG. 3 are bonded. Referring to FIG. 4, the COF 33 may be bonded to the PCB 20 with an anisotropic conductive film (ACF) 40 therebetween. The ACF 40 may correspond to the entire y-axial ranges of the COF 33 and the PCB 20 and may correspond to the entire x-axial ranges of the first and second pad portions 331 and 332 and the first and second corresponding pad portions 21 and 22. The ACF 40 may correspond to the range of the solder resist 336 and the stepped portions 23 and 24 as well, and the ACF 40 may connect the first and second pad portions 331 and 332 with the first and second corresponding pad portions 21 and 22 in a stable conductive structure.

With the PCB 20 bonded to the COF 33, the first thickness t1 that is the sum of the thicknesses of the second wiring line 334 and the solder resist 336 may be larger than a second thickness t2 that is the sum of the thicknesses of the first and second pad portions 331 and 332, the ACF 40, and the first and second corresponding pad portions 21 and 22. For example, the second thickness t2 may be a sum of the thicknesses of the first pad portion 331, the ACF 40, and the first corresponding pad portion 21 and a sum of the thicknesses of the second pad portion 332, the ACF 40, and the second corresponding pad portion 22.

A portion (t1-t2) of the solder resist exceeding the second thickness t2 from the first thickness t1 may be moved, e.g., shifted, and filled in the stepped portions 23 and 24. The portion corresponding to the thickness difference Δt of the solder resist 336, for example, due to the second wiring line 334, may be received in the stepped portions 23 and 24, and the COF 33 and the PCB 20 may be prevented from coming off, e.g., delaminating, with a PCB 20 bonded to a COF 33. The first and second pad portions 331 and 332 of the COF 33 and the first and second corresponding pad portions 21 and 22 of the PCB 20 may be maintained in a firm conductive state by the ACF 40. The reliability of the display device may be improved. A portion of the solder resist 336 may be moved, e.g., transferred, to the stepped portions 23 and 24, and it may be possible avoid the thickness difference Δt in pressing with a pressing tool.

The PCB 20 may include protruding dummy pads 28 and 29 to which a signal is not transmitted, at the stepped portions 23 and 24. For example, the dummy pads 28 and 29 may include a plurality of lines at the stepped portions 28 and 29 and may be made of metal, the same as the first and second corresponding pad portions 21 and 22. The dummy pads may be made of the same material as that of the first cover layer and attached, or the dummy pads may be made of a different material and attached or applied.

The solder resist 336 filled in the stepped portions 23 and 24 may be attached to the dummy pads 28 and 29, and the dummy pads 28 and 29 may more firmly bond the COF 33 and the PCB 20. The ACF 40 may provide adherence to the COF 33 and the PCB 20, in the area without the first and second pad portions 331 and 332 and the first and second corresponding portions 21 and 22. For convenience, only the portion of the ACF 40 which may provide a conductive structure between the first pad portion 331 and the first corresponding pad portion 21 is illustrated in FIG. 5.

A second exemplary embodiment is described hereafter. Comparing the first exemplary embodiment with the second exemplary embodiment, the same configuration as that of the first exemplary embodiment may not be stated, and the difference in configuration is described.

Figure 5:
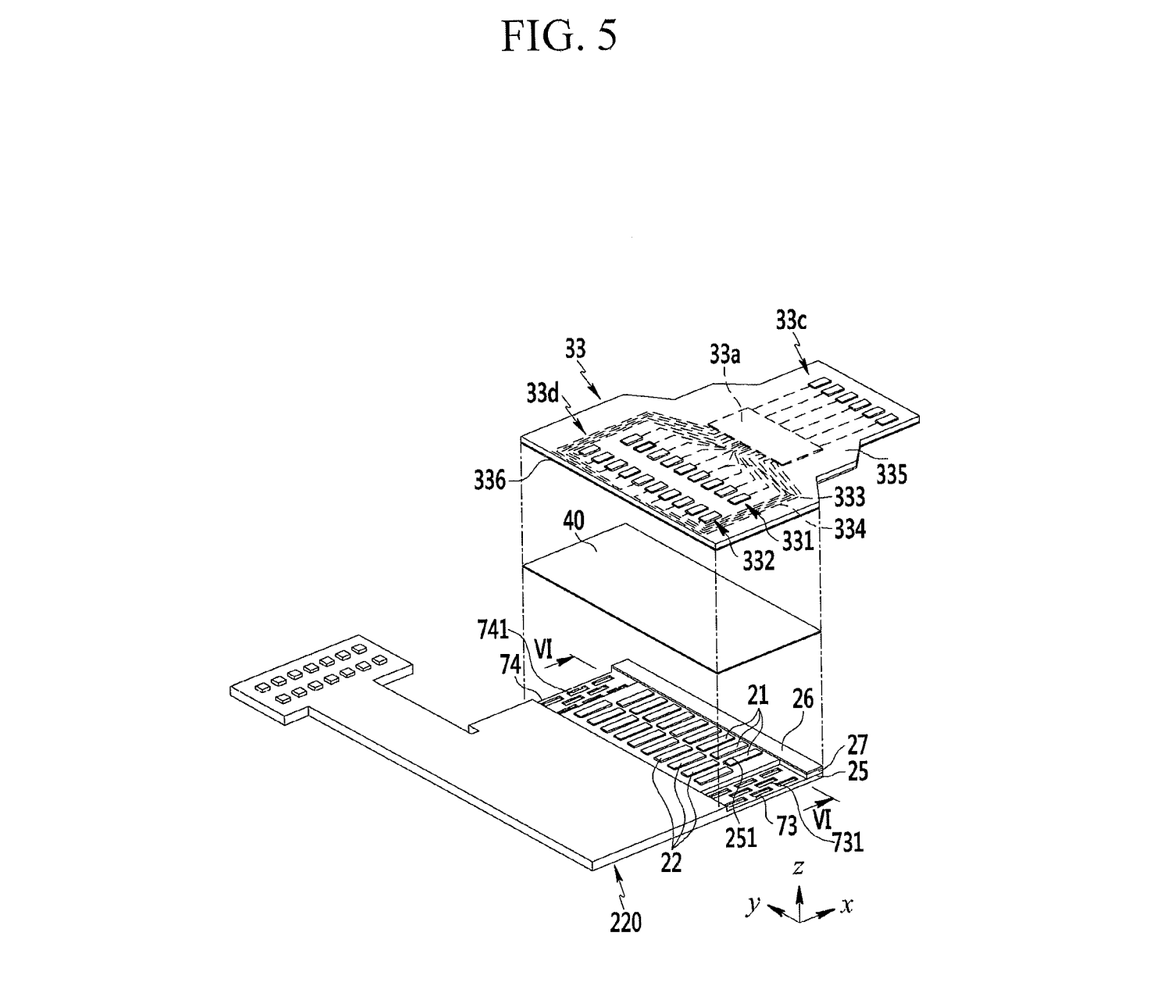
FIG. 5 illustrates an exploded perspective view of a COF and a PCB that are applied to a display device according to a second exemplary embodiment.
Figure 6:
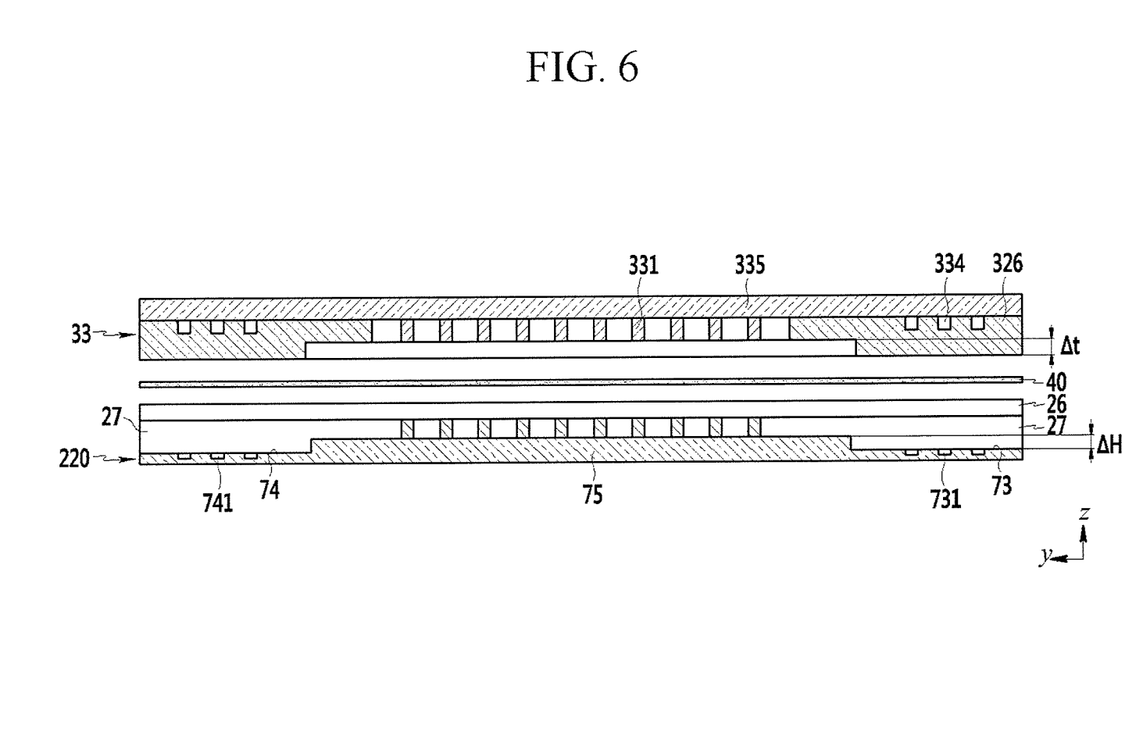
FIG. 6 illustrates an exploded cross-sectional view of the COF and the PCB taken along line VI-VI illustrated in FIG. 5.

FIG. 5 illustrates an exploded perspective view of a COF and a PCB that are applied to a display device according to a second exemplary embodiment, and FIG. 6 illustrates an exploded cross-sectional view of the COF and the PCB taken along line VI-VI illustrated in FIG. 5.

Referring to FIGS. 5 and 6, in a second exemplary embodiment, a PCB 220 may further have adhesion surface extensions 731 and 741 recessed on stepped portions 73 and 74 of a first cover layer 75. The adhesion surface extension 731 and 741 may be made of the material of the first cover layer 75.

The adhesion surface extensions may be convex on the stepped portions. The adhesion surface extensions may be made of a material different from the first cover layer and then attached or applied. The adhesion surface extensions 731 and 741 may include a plurality of lines at the stepped portions 73 and 74, and the lines may be spaced apart from each other.

Figure 7:
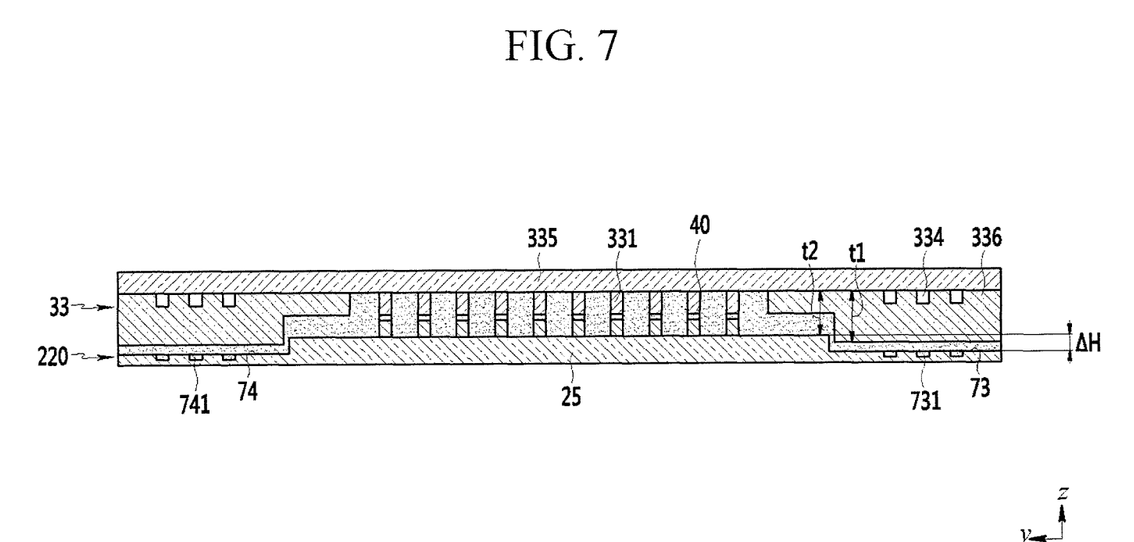
FIG. 7 illustrates a cross-sectional view of a structure in which the COF and the PCB illustrated in FIG. 6 are bonded.

FIG. 7 illustrates a cross-sectional view of a structure in which the COF and the PCB illustrated in FIG. 6 are bonded. Referring to FIG. 7, with a PCB 220 bonded to a COF 33, a portion t1-t2 of a solder resist 336 exceeding a second thickness t2 from a first thickness t1 may be moved and filled in the stepped portions 73 and 74. The portion corresponding to the thickness difference Δt of the solder resist 336, for example, due to a second wiring line 334, may be received in the stepped portions 73 and 74, and the COF 33 and the PCB 220 may be prevented from coming off, e.g., delaminating, with a PCB 220 bonded to a COF 33. First and second pad portions 331 and 332 of the COF 33 and first and second corresponding pad portions 21 and 22 of the PCB 220 may be maintained in a firm conductive state by an ACF 40.

The solder resist 336 filled in the stepped portions 73 and 74 may be attached to the adhesion surface extensions 731 and 741, and the adhesion surface extensions 731 and 741 may more firmly bond the COF 33 and the PCB 220.

The stepped portions 73 and 74 with the concave adhesion surface extensions 731 and 741 may further receive the solder resist 336, as compared with the stepped portions 23 and 24 of the first exemplary embodiment, which may include the dummy pads 28 and 29. It may be possible to further prevent the COF 33 and the PCB 220 from coming off, e.g., delaminating.

By way of summation and review, organic light emitting diode displays may be used when the area, e.g., display area, is large, and a flexible display device and a stretchable display device may include a substrate made of flexible and bendable materials such as plastic and foil, which may allow for a reduction in thickness and weight.

Liquid crystal displays may also be made into a curved display device or a flexible display device.

In a flexible display device, an FPCB having a driving circuit may be connected to an electrode of a display panel, using a COF where a driving integrated circuit may be mounted. The pad portion of the PCB and the pad portion of the COF may be connected in a conductive structure by an ACF.

Pad portions may be connected in a conductive structure between the pad portion of the PCB and the COF and solder resists may be disposed around the pad portions, and the pad portions may be prevented from being exposed to the air. The solder resists may be considerably different in thickness in the applied areas, a gap may be formed between the pad portions, and abnormal operation and bad operation may be generated in tests on reliability of the display devices.

Embodiments relate to a display device in which an integrated circuit film may be bonded on a printed circuit board.

Provided is a display device that may prevent a gap between a pad portion of a COF and a corresponding pad portion of an FPCB when bonding the pad portion and the corresponding pad portion.

According to an exemplary embodiment, a stepped portion may be formed on a PCB and pad portions of a COF may be connected to corresponding pad portions of the PCB, the portion with a thickness difference of a solder resist may be filled in stepped portion, and it may be possible to prevent a gap between the pad portions and the corresponding pad portions.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
 a display panel displaying an image;
 a chip on film (COF) connected to the display panel and on which a driving integrated circuit is mounted; and
 a printed circuit board (PCB) connected to the COF and including a driving circuit for driving the display panel,
 in the COF, on a film, a first pad portion being connected to the driving integrated circuit by a first wiring line, a second pad portion being connected to the driving integrated circuit by a second wiring line, and a solder resist being applied to the first wiring line and the second wiring line, the second pad portion being spaced from and offset from the first pad portion, and
 the PCB including stepped portions at sides of a first corresponding pad portion and a second corresponding pad portion connected with the first pad portion and the second pad portion, respectively, to receive a portion of the solder resist.

2. The display device as claimed in claim 1, wherein the stepped portions correspond to the second wiring line of the COF.

3. The display device as claimed in claim 1, wherein the first pad portion and the second pad portion of the COF are connected to the first corresponding pad portion and the second corresponding pad portion of the PCB, respectively, through an anisotropic conductive film (ACF).

4. The display device as claimed in claim 3, wherein the PCB includes:
 a first cover layer including a plan portion supporting the first corresponding pad portion and the second corresponding pad portion and the stepped portion having a height difference from the plan portion; and
 a second cover layer attached to the first cover layer with an adhesive layer therebetween, the second cover layer exposing the first corresponding portion and the second corresponding portion.

5. The display device as claimed in claim 4, wherein a first thickness that is the sum of thicknesses of the second wiring line, the ACF, and the solder resist is larger than a second thickness that is the sum of thicknesses of the first or second pad portion, the ACF, and the first or second corresponding pad portion.

6. The display device as claimed in claim 5, wherein a part of the solder resist exceeding the second thickness from the first thickness is filled in the stepped portions.

7. The display device as claimed in claim 6, wherein the PCB further includes dummy pads protruding at the stepped portions.

8. The display device as claimed in claim 7, wherein the dummy pads include a plurality of lines at the stepped portions.

9. The display device as claimed in claim 7, wherein the solder resist filled in the stepped portions is attached to the dummy pads.

10. The display device as claimed in claim 1, wherein:
the driving integrated circuit is disposed in a second direction crossing a first direction in which the film is elongated,
the first pad portion is spaced from the driving integrated circuit in the first direction,
the first wiring line connects the first pad portion to the driving integrated circuit,
the second pad portion is spaced from the first pad portion in the first direction, and
the second wiring line is connected to the driving integrated circuit, the second wiring line disposed around the first pad portion, the second pad portion, and the first wiring line.

11. The display device as claimed in claim 4, wherein the PCB further has adhesion surface extensions formed concavely or convexly at the stepped portions.

12. The display device as claimed in claim 11, wherein the adhesion surface extensions include a plurality of lines at the stepped portions.

13. The display device as claimed in claim 12, wherein the plurality of lines are spaced from each other.

14. The display device as claimed in claim 12, wherein the solder resist filled in the stepped portions is attached to the adhesion surface extensions.

* * * * *